(12) United States Patent
Volk

(10) Patent No.: US 6,369,734 B2
(45) Date of Patent: Apr. 9, 2002

(54) METHOD AND APPARATUS FOR INCREASING LINEARITY AND REDUCING NOISE COUPLING IN A DIGITAL TO ANALOG CONVERTER

(75) Inventor: Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/021,609

(22) Filed: Feb. 10, 1998

(51) Int. Cl.[7] .............................. H03M 1/66; H03M 1/10
(52) U.S. Cl. ........................................ 341/144; 341/120
(58) Field of Search .................................. 341/144, 120, 341/136, 118, 145, 133, 161; 327/543, 408, 409, 375; 302/131

(56) References Cited

U.S. PATENT DOCUMENTS

| | | | |
|---|---|---|---|
| 4,553,132 A | * 11/1985 | Dingwall et al. | 341/136 |
| 4,663,610 A | * 5/1987 | Metz et al. | 341/133 |
| 5,666,118 A | * 9/1997 | Gersbach | 341/120 |
| 5,689,257 A | * 11/1997 | Mercer et al. | 341/133 |

FOREIGN PATENT DOCUMENTS

EP  652641  * 11/1994

OTHER PUBLICATIONS

Bowers, "A New Technique for Monolithic D/A Conversion," IEEE, 257–260.*

Chin, Shu–Yuan and Wu, Chung–Yu, IEEE Journal of Solid–State Circuits, "A 10–b 125–MHz CMOS Digital–to–Analog Converter (DAC) with Threshold–Voltage Compensated Current Sources", vol. 29, No. 11, Nov. 1994, pp. 1374–1380.

Wu, Tien–Yu, Jih, Ching–Tsing, Chen, Jueh–Chi and Wu, Chung–Yu, IEEE Journal of Solid–State Circuits, "A Low Glitch 10–bit 75–MHz CMOS Video D/A Converter", vol. 30, No. 1, Jan. 1995, pp. 68–72.

* cited by examiner

*Primary Examiner*—Patrick Wamsley
(74) *Attorney, Agent, or Firm*—Blakely, Sokoloff, Taylor & Zafman LLP

(57) ABSTRACT

A DAC stage having a ground offset switch driver control signal generator, provides greater linearity by preventing rail-to-rail voltage swings of the switch driver signals. In one embodiment of the present invention, a pair of inverting logic gates, coupled between a power rail and a node positively offset from ground, are used to drive the current switches in a DAC stage.

14 Claims, 5 Drawing Sheets

METHOD AND APPARATUS FOR INCREASING LINEARITY AND REDUCING NOISE COUPLING IN A DIGITAL TO ANALOG CONVERTER

BACKGROUND OF THE INVENTION

1. Field of the Invention

The present invention relates generally to digital-to-analog converter DAC) circuits, and more particularly to DAC circuits for improved current switch linearity.

2. Background

Recent advances in semiconductor manufacturing technology and computer architecture have combined to provide relatively low-cost computer platforms having sufficient computational power to enable visual computing. In addition to being computationally robust, a visual computing platform must also have a high performance graphics subsystem, which typically includes a DAC.

DACs of the type commonly used for driving video and graphics display devices are called current mode DACs. Current mode DACs are made up of many current sources (e.g., 255 in an 8-bit linearly weighted DAC), each current source representing one or more least significant bits (LSB) of the DAC output. The currents are steered to either the output or to another node, typically ground, depending on the digital input code presented to the DAC for conversion. As shown in FIG. 1, the currents are summed and then converted to an output voltage by a resistor ($R_{LOAD}$) connected from the output pad to ground. An important aspect of a DAC is the linearity achieved in the DAC output as the input codes to the DAC are changed.

Many DACs are implemented using Complementary Metal Oxide Semiconductor (CMOS) processes. CMOS processes make both n-channel field effect transistors (NFETs) and p-channel field effect transistors (PFETs) available to circuit designers. As is well known, FETs have various operating regions, for example unsaturated and saturated, wherein the current that flows between the source and drain of a FET may be either strongly related to the drain-to-source voltage, or weakly related to (or even independent of) the drain-to-source voltage. In designing circuits having linear characteristics, it is less difficult to achieve the desired signal processing goal by operating FETs in the saturated region of operation where the current flowing between the source and drain is substantially a function of the applied gate-to-source voltage (Vgs).

As the physical dimensions of transistors continue to shrink with more advanced semiconductor manufacturing techniques, circuit designers have been constrained to circuits that require lower and lower operating voltages.

The reduction of operating voltages makes it increasingly difficult to maintain the current switches in a DAC in the saturated region of operation.

What is needed is a method and apparatus for providing improved linearity to CMOS DAC circuits operated at supply voltages that are low compared to the drain-to-source voltages required for FETs to operate in the saturated region.

SUMMARY OF THE INVENTION

Briefly, a DAC stage having a ground offset switch driver control signal generator, provides greater linearity by preventing rail-to-rail voltage swings of the switch driver signals.

In one embodiment of the present invention, a pair of inverting logic gates, coupled between a power rail and a node positively offset from ground, are used to drive the current switches in a DAC stage.

Various other features and advantages of the present invention will be apparent from the accompanying drawings and from the detailed description that follows below.

Figure 1:
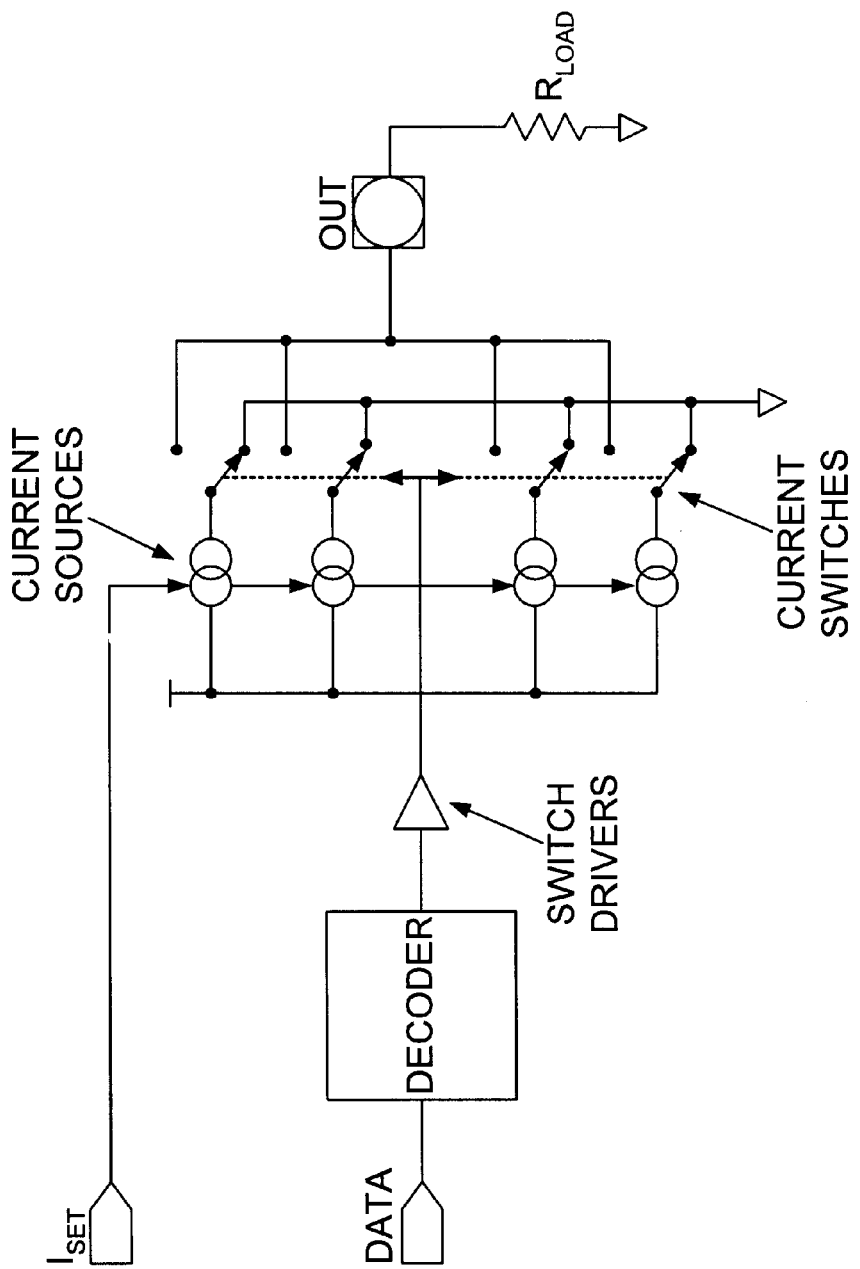
FIG. 1 is a block diagram of a basic DAC architecture.

While the invention is susceptible to various modifications and alternative forms, specific embodiments thereof have been shown by way of example in the drawings and are herein described in detail. It should be understood however, that the description herein of specific embodiments is not intended to limit the invention to the particular forms disclosed, but on the contrary, the intention is cover all modifications, equivalents, and alternatives falling within the spirit and scope of the invention as defined by the Claims.

DETAILED DESCRIPTION

Illustrative embodiments of the present invention are described below. In the interest of clarity, not all aspects of an actual implementation are described in this specification. It will of course be appreciated that in the development of any such actual embodiment, numerous implementation-specific decisions must be made to achieve the developer's specific goals, such as compliance with system-related, and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al) or an alloy of Al and copper (Cu), are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor substrate is considered, for the purpose of describing illustrative embodiments of the present invention, the FET will be described using the traditional gate-drain-source, three terminal model.

Vcc and Vdd are terms often employed in this field to refer to a both positive power supply voltage, and a positive power supply node, depending on the context of its usage. Such usage is well understood by those of ordinary skill in this field.

Vss is a term often employed in this field to refer to ground. As used herein, ground refers to the lowest potential power supply node. All voltages referred to herein are measured with reference to ground.

The configuration and operation of a current mode DAC are described with reference to FIG. 2, which is a schematic of a typical D/A stage 200 used in a DAC. Several such stages are coupled in parallel to an output node 202. Such an output node is typically connected to a chip output terminal such as an output pad 203. The several D/A stages coupled in parallel are sometimes referred to as a DAC channel. Each D/A stage 200 contributes a portion of the total output current, using binary weighting, linear weighting, or a combination of binary and linear weighting between the D/A stages. The output current is converted to a voltage by a resistor 204 connected between output node 203 and ground.

Figure 2:
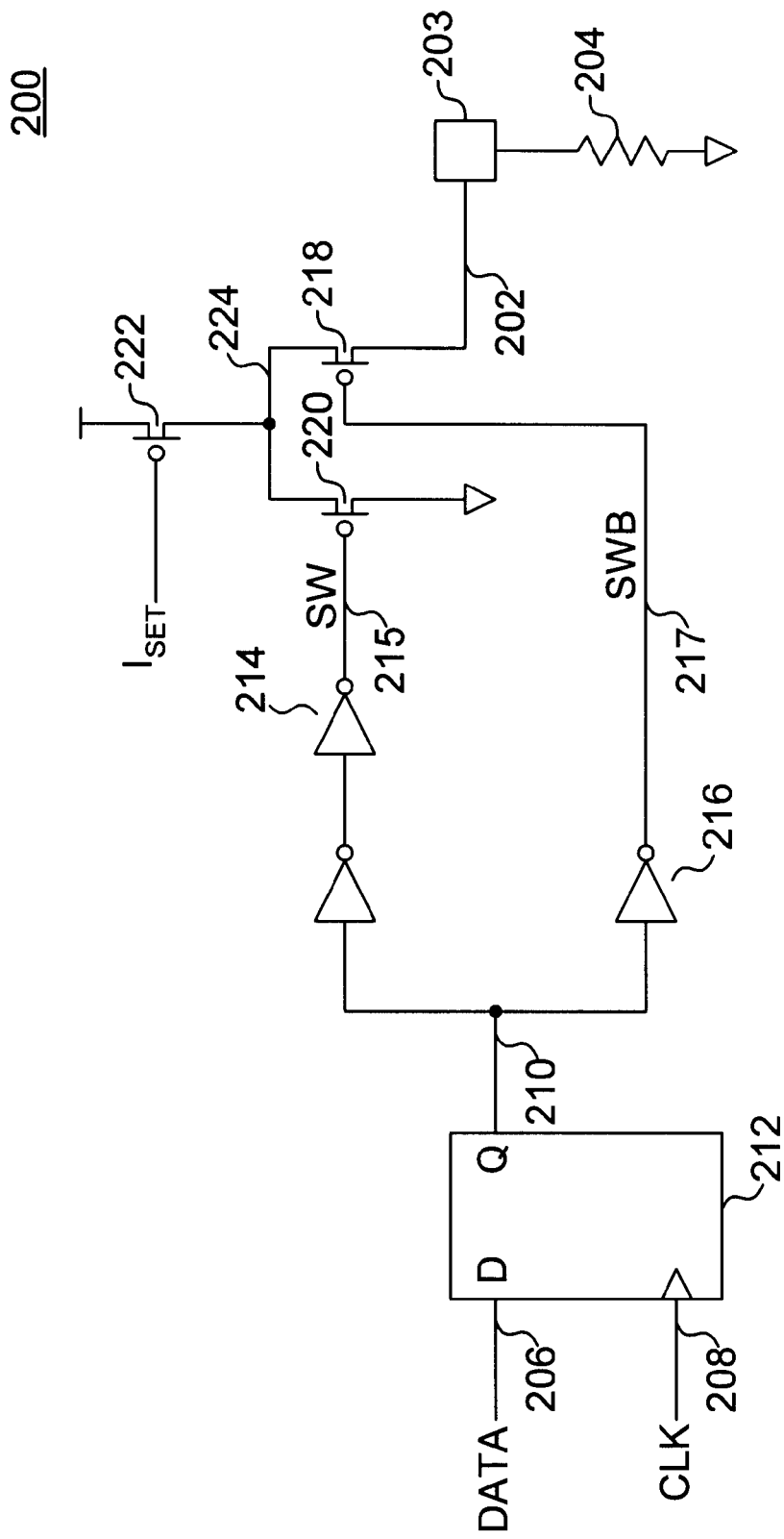
FIG. 2 is a schematic diagram of a DAC stage suitable for use in a graphics application.

Still referring to the circuit shown in FIG. 2, it can be seen that an input data signal 206 is synchronized to a clock signal 208 to reduce timing skew between D/A stages 200 in a channel. An output terminal 210 of a data latch 212 is coupled to a pair of switch drivers 214, 216. Switch drivers 214, 216 generate complementary switch control signals SW 215 and SWB 217.

A pair of current switch transistors 218, 220 work in opposing phase to either direct the current from a current source, PFET 222 in this example, to output pad 203 or to ground. Switching the current in this fashion tends to reduce the current fluctuations through PFET 222. Additionally, switching the current in this fashion tends to reduce charge sharing glitches that result in nonideal output waveforms.

The amount of current from PFET 222 is controlled by the signal Iset, and the effective size of PFET 222.

Ignoring second order effects and assuming the voltage at pad 203 is near ground (i.e., PFETs 218, 220 in saturation), node 224 remains at the same level regardless of which of SW 215 or SWB 217 is active. This means that the voltage across current source PFET 222 is also constant which allows the current from the current source to be constant.

The voltage on node 224 is the gate to source voltage (Vgs) of PFET 218 or PFET 220, depending on which switch control signal is at ground. The threshold voltage of switch transistors 218, 220 is increased by body effect. In typical operation, node 224 typically has a voltage of approximately 1.0 volt.

However as the voltage at pad 203 rises, the voltage across PFET 218 drops. When the voltage is small enough, the PFET 218 drops out of saturation and the voltage on node 224 will rise with the voltage at pad 203. This changes the voltage across the current source and, consequently the current through PFET 222 starts to fall off. This knee in the current curve often happens before the output gets to full scale, and results in an undesired non-linearity in the DAC output signal.

As mentioned above, supply voltages are being reduced in new designs making it difficult and costly to include additional transistors to cascode the current sources. So the current switches are serving this function. However, the thresholds on the current switches are low enough that the switches do not remain in their saturated state for the entire output voltage range (e.g., 0.0 to 1.0 volts). When the switches come out of saturation the linearity of the DAC is compromised. Embodiments of the present invention allow the current switches to remain saturated without losing the voltage headroom and the layout space of another series (cascode) transistor.

Additionally, a typical switch driver output swings from rail to rail. The switch transitions couple noise into the output signal by virtue of the parasitic capacitors inherent in the gate, source and drain structure of a FET. Reducing the voltage swing of the switch driver output signal reduces the coupled noise. When a conventional switch driver output is low, the noise reference is from ground. Embodiments of the invention allow the noise from the switch driver to be associated with the Vcc node. This is the same node that forms the bulk node of the PFET current switch transistor and the node to which the current source gate voltage is referenced. This makes any coupled noise common mode and reduces noise coupled to the output.

Linearity can be improved if the current switch can remain in saturation for the entire output voltage range. In the embodiment illustrated in FIG. 3, current switches are implemented as PFETs 404, 406. This requires node 403 to operate at a higher voltage to give the output more headroom. The voltage level of node 403 is set by the gate voltage of either PFET 404, 406. In order to raise the minimum voltage on node 403 the gate voltages of PFET 404, 406 have to be raised. This is accomplished by limiting the swing of the switch driver outputs and not allowing them to swing all the way to ground. The added offset from ground will raise the voltage on node 403 by a like amount.

Figure 5B:
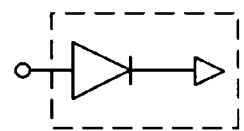
FIG. 5(b) is a schematic of another implementation of a low impedance ground offset voltage generator.
Figure 4E:
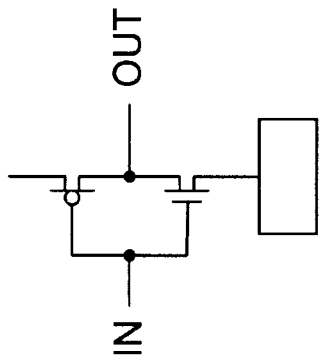
FIG. 4(e) shows a schematic symbol of an inverter including the power supply connections to power and ground offset voltage nodes.
Figure 5A:
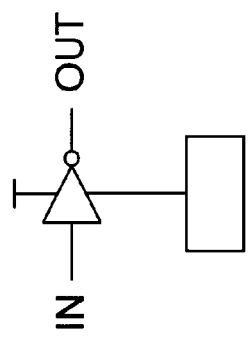
FIG. 5(a) is a schematic of one implementation of a low impedance ground offset voltage generator.

Typically, the ground offset voltage is not large, and values of approximately 0.5 volts are sufficient for the illustrated embodiment. Those skilled in the art will recognize that there are many suitable ways to generate such an offset voltage. For example, a low impedance source can be developed on chip to replace the ground connection of the switch drivers. This voltage could come from a tap from a voltage source through a buffer (either a voltage reference source used to set the current source levels or the supply voltage itself) or by using a biased diode such as a p+ junction in a grounded n-well (see FIG. 5(a)). Alternatively, the offset voltage can be developed by ratioed, simultaneously conducting transistors (see FIG. 5(b)). This method is a bit more difficult to control, and uses more power. Whatever method for generating an offset voltage is selected, the offsets should be matched for a given set of switch drivers to keep node 403 at substantially the same voltage with either switch driver active.

An alternative is to regulate the switch voltage with respect Vcc. The switch voltage has to work well for all power supply voltages. The advantage is that the noise reference is now with respect to Vcc, the same reference as for the ISET control voltage and the bulk node of the PFET current source and PFET current switch transistors.

A compromise solution is use a Vcc to ground divider to set the offset voltage about 0.5 volts from ground and then bypass the offset voltage with respect to Vcc to get the proper noise reference.

Figure 3:
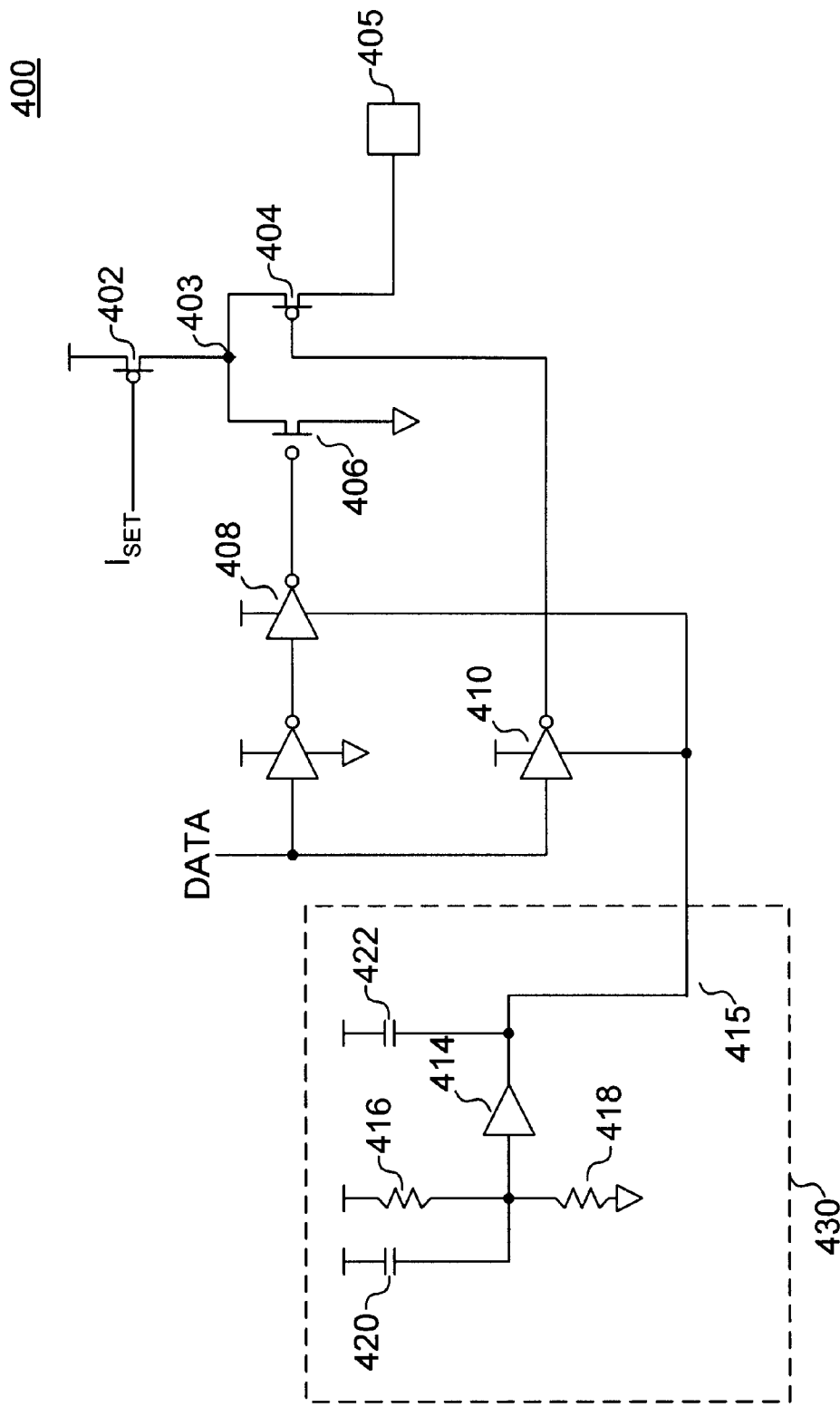
FIG. 3 is a schematic diagram of a DAC stage with ground offset switch drivers in accordance with the present invention.
Figure 4B:
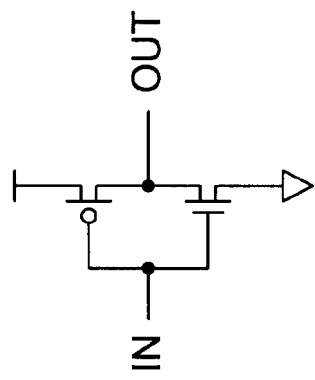
FIG. 4(b) is a transistor level schematic of the symbol of FIG. 4(a).
Figure 4D:
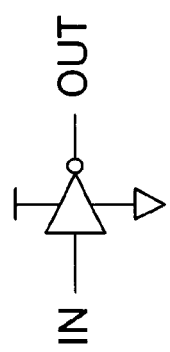
FIG. 4(d) is a transistor level schematic of the symbol of FIG. 4(c).
Figure 4A:
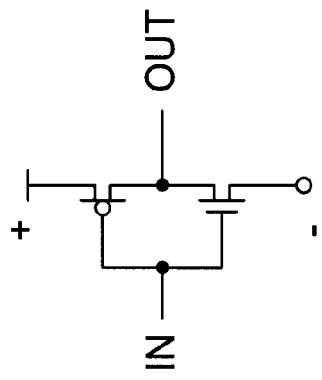
FIG. 4(a) shows a schematic symbol of an inverter including the power supply connection terminals.
Figure 4C:
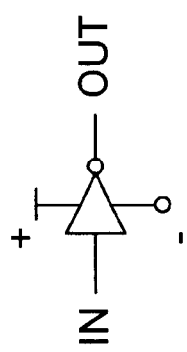
FIG. 4(c) shows a schematic symbol of an inverter including the power supply connections to power and ground nodes.
Figure 4F:
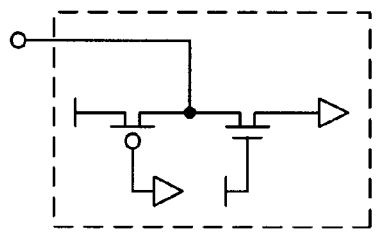
FIG. 4(f) is a transistor level schematic of the symbol of FIG. 4(e).

FIG. 3 shows a low impedance ground offset reference 430 that uses a resistor divider 416, 418 to set the output of a buffer 414 to about 0.5 volts, and uses bypass capacitors 420, 422 connected to Vcc to set the noise reference. The buffer output voltage replaces the Vss supply connection in switch drivers 408, 410. Other methods can be used to set the offset voltage as long as the bypassing is added to Vcc in order to properly reference the noise.

FIGS. 4(*a*)–4(*f*) show various inverter configurations to help illustrate the implementations of ground offset switch drivers in accordance with the present invention. More particularly, FIG. 4(*a*) shows a symbol for an inverter including the positive and negative power supply connection terminals. The inverter shown in FIG. 4(*a*) can be used to as a ground offset current switch driver in accordance with the present invention when the negative power supply connection terminal is coupled to a low impedance ground offset voltage generator. It will be appreciated by those skilled in the art having the benefit of the teachings herein, that various other circuits or logic gates can be used to implement the ground offset current switch drivers. For example, NOR gates could be used in place of the inverter configurations shown.

FIG. 4(*b*) shows a transistor level schematic of the inverter shown symbolically in FIG. 4(*a*). FIGS. 4(*c*) and 4(*d*) show a conventional inverter configuration with direct power and ground connections.

FIGS. 4(*e*) and 4(*f*) show a ground offset current switch driver, both symbolically and at the transistor level. In this configuration the negative power supply connection terminal is coupled to a low impedance ground offset voltage generator.

FIGS. 5(*a*)–(*b*) show alternative implementations of low impedance ground offset voltage generators. More particularly, FIG. 5(*a*) shows a diode as a low impedance ground offset circuit. FIG. 5(*b*) shows a pair of ratioed transistors, coupled in series between power and ground nodes, configured to provide a low impedance path to ground but with a voltage that is offset from ground. The magnitude of the ground offset, as is well understood in this field, will be a function of the transistor sizes and particular characteristics of the semiconductor process in which the circuit is implemented. It will be appreciated by those skilled in the art having the benefit of the teachings herein, that various other implementations of low impedance ground offset generator circuits are possible.

CONCLUSION

The present invention provides a method and apparatus for increasing the linear range of the output signal of digital to analog converters. By limiting the voltage swing at the current switch inputs, the present invention allows FET current switches to remain in saturation and thereby provide the substantially constant current flow necessary for linear operation of the DAC.

An advantage of embodiments of the present invention is improved linear range for DACs implemented on low voltage CMOS processes.

A further advantage of embodiments of the present invention is reduced clock noise feedthrough to the output of a DAC.

A still further advantage of embodiments of the present invention is that noise coupling sources within the current switch of the DAC are made common-mode.

The particular embodiments disclosed above are illustrative only, as the invention may be modified and practiced in different but equivalent manners apparent to those skilled in the art having the benefit of the teachings herein. Furthermore, no limitations are intended to the details of the construction or design herein shown, other than as described in the Claims. It will be readily understood by those skilled in the art that various other changes in the details, materials, and arrangements of the parts and steps which have been described and illustrated in order to explain the nature of this invention may be made without departing from the principles and scope of the invention as expressed in the subjoined Claims.

What is claimed is:

1. A circuit comprising:
 a current source having a current output terminal;
 a current switch having a current input terminal coupled to the current output terminal of the current source, and further having at least two control input terminals; and
 a ground offset switch driver signal generator coupled to the at least two control input terminals during normal operation, said signal generator for generating an offset voltage.

2. The circuit of claim 1, wherein the ground offset switch driver signal generator comprises at least one inverting logic gate having an input terminal, an output terminal, a positive power supply connection terminal and a negative power supply connection terminal.

3. The circuit of claim 2, further comprising a ground offset voltage generator coupled to the negative power supply connection terminal of the ground offset switch driver signal generator.

4. The circuit of claim 3, wherein the ground offset voltage generator comprises a diode.

5. The circuit of claim 2, wherein the inverting logic gate is an inverter.

6. The circuit of claim 1, wherein the current switch comprises:
 a first field effect transistor coupled between the current output terminal of the current source and a first current sink; and
 a second field effect transistor coupled between the current output terminal of the current source and a second current sink.

7. The circuit of claim 6, wherein the first field effect transistor is a PFET and the second field effect transistor is a PFET.

8. The circuit of claim 6, wherein the first current sink is ground.

9. The circuit of claim 1, wherein the current source comprises at least one field effect transistor.

10. The circuit of claim 1, wherein the current source comprises a PFET.

11. A digital to analog converter comprising:
 an output node; and
 a plurality of digital-to-analog (D/A) stages, each D/A stage having a current output terminal coupled to the output node;

wherein at least one D/A stage comprises:
- a current source having a current output terminal;
- a current switch having a current input terminal coupled to the current output terminal of the current source, a current output terminal coupled to current output terminal of the D/A stage, and further having at least two control input terminals; and
- a ground offset switch driver signal generator coupled to the at least two control input terminals during normal operation, said signal generator generating an offset voltage.

12. The digital to analog converter of claim 11 wherein the ground offset switch driver signal generator comprises at least one inverting logic gate having an input terminal, an output terminal, a positive power supply connection terminal and a negative power supply connection terminal.

13. The digital to analog converter of claim 11, further comprising a ground offset voltage generator coupled to the negative power supply connection terminal of the ground offset switch driver signal generator.

14. A method of operating current switches in a DAC comprising:
- providing a current source;
- providing at least a pair of current switches coupled to the current source;
- generating a low impedance ground offset voltage source;
- operating current switch control circuits coupled to the current switches and the low impedance ground offset voltage source during normal operation, said signal generator generating an offset voltage.

* * * * *